(12) United States Patent
Kim

(10) Patent No.: US 8,812,775 B2
(45) Date of Patent: Aug. 19, 2014

(54) SYSTEM AND METHOD FOR CONTROLLING NONVOLATILE MEMORY

(75) Inventor: Byoung Geun Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 151 days.

(21) Appl. No.: 13/430,850

(22) Filed: Mar. 27, 2012

(65) Prior Publication Data

US 2012/0254581 A1   Oct. 4, 2012

(30) Foreign Application Priority Data

Mar. 28, 2011 (KR) ........................ 10-2011-0027728

(51) Int. Cl.
G06F 12/02 (2006.01)

(52) U.S. Cl.
USPC ............................. 711/103; 711/173; 711/203

(58) Field of Classification Search
USPC .......................................................... 711/203
See application file for complete search history.

(56) References Cited

U.S. PATENT DOCUMENTS

| | | | |
|---|---|---|---|
| 2008/0077729 A1 | 3/2008 | Kim et al. | |
| 2008/0104309 A1 | 5/2008 | Cheon et al. | |
| 2008/0172520 A1 | 7/2008 | Lee | |
| 2008/0172521 A1 | 7/2008 | Lee | |
| 2009/0049234 A1 | 2/2009 | Oh et al. | |
| 2009/0193184 A1 | 7/2009 | Yu et al. | |
| 2009/0327590 A1* | 12/2009 | Moshayedi | 711/103 |
| 2010/0115192 A1* | 5/2010 | Lee | 711/103 |
| 2010/0122016 A1* | 5/2010 | Marotta et al. | 711/103 |
| 2010/0153616 A1* | 6/2010 | Garratt | 711/6 |
| 2011/0022786 A1* | 1/2011 | Yeh et al. | 711/103 |
| 2011/0107042 A1* | 5/2011 | Herron | 711/161 |
| 2011/0191523 A1* | 8/2011 | Caulkins | 711/103 |

FOREIGN PATENT DOCUMENTS

| | | |
|---|---|---|
| KR | 100771521 B1 | 10/2007 |
| KR | 1020080028685 A | 4/2008 |
| KR | 1020080067509 A | 7/2008 |
| KR | 1020080067834 A | 7/2008 |
| KR | 1020090017238 A | 2/2009 |
| KR | 1020100111992 A | 10/2010 |

OTHER PUBLICATIONS

Sungjin Lee et al., FlexFS, A Flexible Flash File System for MLC NAND Flash Memory, 2009, USENIX Annual Technical Conference, Seoul National University.*

Muthukumar Murugan and David Du, Navi: Towards Improved Performance in NAND Flash Based Hybrid SLC-MLC Devices, Fall 2011, University of Minnesota, http://www-users.cselabs.umn.edu/classes/Fall-2011/csci8980-ass/files/SSD/Hybrid-SLC-MLC.pdf.*

* cited by examiner

*Primary Examiner* — Reginald Bragdon
*Assistant Examiner* — Leandro Villanueva
(74) *Attorney, Agent, or Firm* — Volentine & Whitt, PLLC

(57) ABSTRACT

A memory system, comprises a nonvolatile memory comprising multiple memory cells, and a memory controller configured to control respective cell levels of the memory cells by assigning a logical address of each memory cell to one of multiple address groups according to a frequency with which the logical address has been accessed, determining a cell level for each address group, and controlling each memory cell to have the cell level of the address group to which its logical address is assigned.

18 Claims, 16 Drawing Sheets

Fig. 5

| Number of accumulated particles | Particle | Weight |
|---|---|---|
| 1 | P24 | 0.12 |
| 2 | P25 | 0.08 |
| 3 | P26 | 0.08 |
| ⋮ | ⋮ | ⋮ |
| 40 | P23 | 0.04 |
| 41 | P65 | 0.039 |
| ⋮ | ⋮ | ⋮ |
| 80 | P1 | 0.03 |
| 81 | P2 | 0.029 |
| ⋮ | ⋮ | ⋮ |
| 194 | P51 | 0 |
| 195 | P52 | 0 |
| 196 | P53 | 0 |
| 197 | P199 | 0 |
| 198 | P200 | 0 |
| 199 | P90 | 0 |
| 200 | P92 | 0 |

Rows 1–40: AG1
Rows 41–80: AG2
Rows 81–200: AG3

| Particle | AGI |
|----------|------|
| P1 | AGI2 |
| P2 | AGI3 |
| ⋮ | ⋮ |
| P24 | AGI1 |
| P25 | AGI1 |
| ⋮ | ⋮ |
| P199 | AGI3 |
| P200 | AGI3 |

Fig. 13

| Row No. | Particle | Weight | Accumulated weight | Accumulated Storage Capacity(%) |
|---|---|---|---|---|
| 1 | P24 | 0.12 | 0.12 | 0.5 |
| 2 | P25 | 0.08 | 0.20 | 1 |
| 3 | P26 | 0.08 | 0.28 | 1.5 |
| ... | ... | ... | ... | ... |
| 40 | P23 | 0.04 | 0.60 | 20 |
| 41 | P65 | 0.04 | 0.64 | 20.5 |
| ... | ... | ... | ... | ... |
| 80 | P1 | 0.03 | 0.80 | 40 |
| 81 | P2 | 0.03 | 0.83 | 40.5 |
| ... | ... | ... | ... | ... |
| 194 | P51 | 0 | 1.00 | 97 |
| 195 | P52 | 0 | 1.00 | 97.5 |
| 196 | P53 | 0 | 1.00 | 98 |
| 197 | P199 | 0 | 1.00 | 98.5 |
| 198 | P200 | 0 | 1.00 | 99 |
| 199 | P90 | 0 | 1.00 | 99.5 |
| 200 | P92 | 0 | 1.00 | 100 |

|  | R1 | R2 | R3 | Storage Capacity of MC of cell level1(%) | Storage Capacity of MC of cell level2(%) | Storage Capacity of MC of cell level3(%) |
|---|---|---|---|---|---|---|
| Case0 | 0 | 1.00 | 0 | 0 | 100 | 0 |
| Case1 | 0.01 | 0.98 | 0.01 | 0.5 | 98 | 1.5 |
| Case2 | 0.02 | 0.96 | 0.02 | 1 | 96 | 3 |
| ... | ... | ... | ... | ... | ... | ... |
| Case40 | 0.40 | 0.20 | 0.40 | 20 | 20 | 60 |
| Case41 | 0.41 | 0.18 | 0.41 | 20.5 | 18 | 61.5 |
| ... | ... | ... | ... | ... | ... | ... |
| Case49 | 0.49 | 0.02 | 0.49 | 24.5 | 2 | 73.5 |
| Case50 | 0.50 | 0 | 0.50 | 25 | 0 | 75 |

SYSTEM AND METHOD FOR CONTROLLING NONVOLATILE MEMORY

CROSS-REFERENCE TO RELATED APPLICATIONS

This application claims priority under 35 U.S.C §119 to Korean Patent Application No. 10-2011-0027728 filed on Mar. 28, 2011, the subject matter of which is hereby incorporated by reference.

BACKGROUND OF THE INVENTION

Embodiments of the inventive concept relate generally to electronic memory technologies. More particularly, embodiments of the inventive concept relate to memory systems comprising nonvolatile memory and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power.

Examples of volatile memory devices include static random access memory (SRAM), dynamic random access memory (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

Among nonvolatile memory devices, flash memory has gained increasing popularity in recent years due to various attractive features such as relatively high storage capacity, fast performance, and the ability to withstand physical shock. Moreover, there is a continuing demand for flash memory devices with even greater storage capacity and performance. Accordingly, researchers continue to pursue ways to improve flash memory devices to meet these demands.

SUMMARY OF THE INVENTION

In one embodiment, a memory system, comprises a nonvolatile memory comprising multiple memory cells, and a memory controller configured to control respective cell levels of the memory cells by assigning a logical address of each memory cell to one of multiple address groups according to a frequency with which the logical address has been accessed, determining a cell level for each address group, and controlling each memory cell to have the cell level of the address group to which its logical address is assigned.

In another embodiment, a method is provided for controlling a nonvolatile memory comprising a plurality of memory cells. The method comprises controlling the respective memory cells to operate at multiple different cell levels, assigning an address input from a host to one of multiple address groups each corresponding to a memory cell group comprising memory cell of the same cell level, reassigning the address to a different address group according to a number of times that the address has been accessed.

In another embodiment, a method is provided for operating a memory system comprising a host and a nonvolatile memory device. The method comprises transmitting a logical address from the host to the nonvolatile memory device, assigning the logical address to an address group according to a number of times the logical address has been accessed, and operating memory cells associated with the logical address at one of first through n-the cell levels according to a memory cell group associated with the address group.

These and other embodiments can improve the performance of nonvolatile memory devices by configuring memory cell operations according to the frequency of data access.

BRIEF DESCRIPTION OF THE DRAWINGS

The drawings illustrate selected embodiments of the inventive concept. In the drawings, like reference numbers indicate like features.

FIG. 5 is a diagram illustrating an example of a pattern table shown in FIG. 2 according to an embodiment of the inventive concept.

FIG. 6 is a diagram illustrating an example of an address group table updated according to the pattern table of FIG. 5.

FIG. 13 is a diagram illustrating an example of a pattern table in the memory system of FIG. 11.

FIG. 14 is a diagram illustrating different combinations of cell level ratios according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, the terms first, second, third, etc., may be used to describe various features, but the described features should not be limited by these terms. Rather, these terms are used merely to distinguish between different features. Accordingly, a first feature discussed below could be termed a second feature without changing the meaning of the description.

The terminology used herein is for the purpose of describing particular embodiments only and is not intended to limit the scope of the inventive concept. The singular forms "a", "an" and "the" are intended to encompass the plural forms as well, unless the context clearly indicates otherwise. The terms "comprises" and/or "comprising," when used in this specification, specify the presence of stated features, but they do not preclude the presence or addition of one or more other features. The term "and/or" indicates any and all combinations of one or more of the associated listed items.

Where a feature is referred to as being "connected to" or "coupled to" another feature, it can be directly connected or coupled, or intervening features may be present. In contrast, where a feature is referred to as being "directly connected to" or "directly coupled to" another feature, there are no intervening elements or layers present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the this description and will not be interpreted in an idealized or overly formal sense unless expressly so defined herein.

Figure 1:
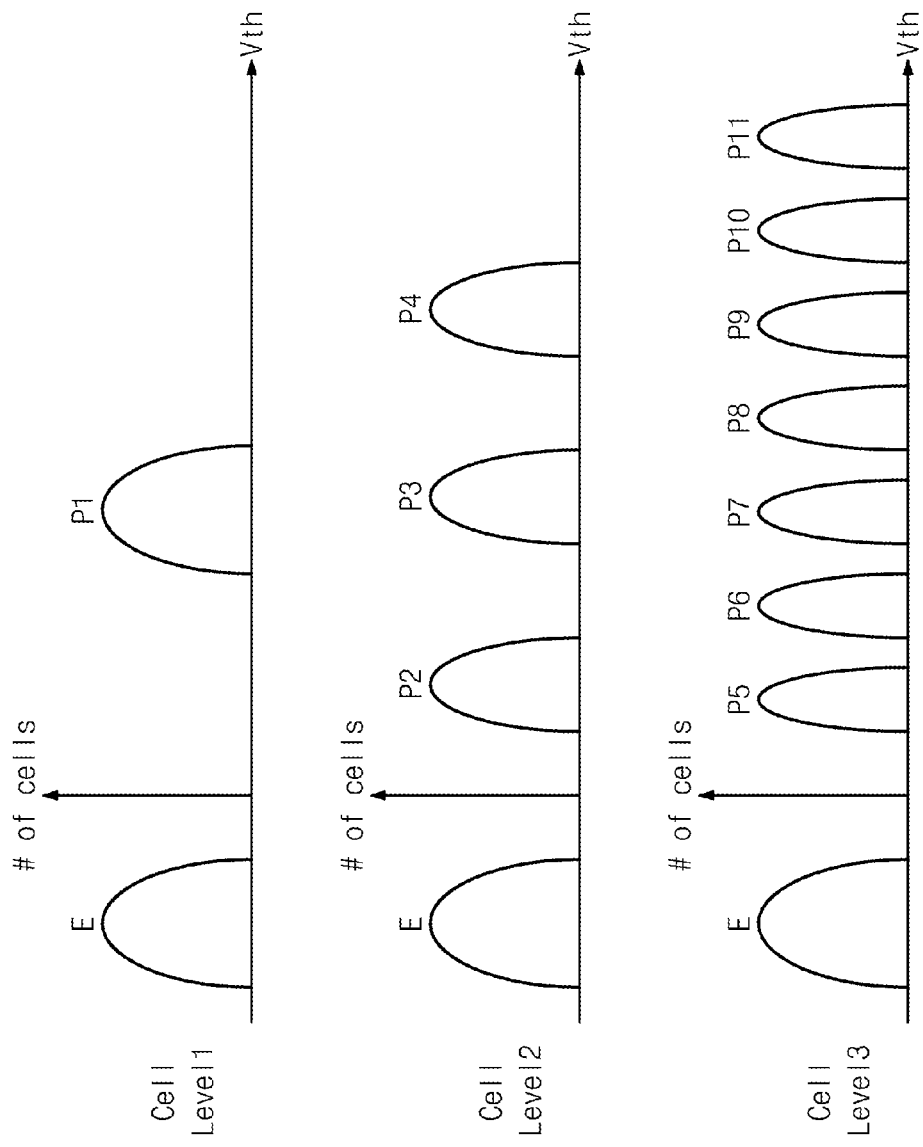
FIG. 1 is a diagram illustrating logic states of programmed memory cells in a nonvolatile memory.

FIG. 1 is a diagram illustrating logic states of programmed memory cells in a nonvolatile memory. The diagram includes top, middle, and bottom graphs that represent the logic states of three different types of memory cells.

Referring to FIG. 1, in each graph, a horizontal axis represents a threshold voltage, and a vertical axis represents a number of memory cells. The top graph represents logic states of a memory cell capable of storing one bit. Such a memory cell can be referred to as a single level cell (SLC) or a memory cell of a first cell level "Level1". The middle graph represents logic states of a memory cell capable of storing two bits. Such a memory cell can be referred to as a 2-bit multilevel cell (MLC), or a memory cell of a second cell level "Level2". The bottom graph represents logic states of a memory cell capable of storing three bits. Such a memory cell can be referred to as a 3-bit MLC, or a memory cell of a third cell level "Level3".

The SLC stores 1-bit data by programming it to one of an erase state E and a first program state P1, where erase state E corresponds to a logical value '1', and first program state P1 corresponds to a logical value '0'.

The 2-bit MLC stores 2-bit data by programming it to one of an erase state E and second through fourth program states P2 through P4, where erase state E corresponds to a logical value '11', and second through fourth program states P2 through P4 correspond to logical values '01', '10', and '00', respectively.

The 3-bit MLC stores 3-bit data by programming it to one of an erase state E and fifth through eleventh program states P5 through P11, where erase state E corresponds to a logical value '111', and fifth through eleventh program states P5 through P11 correspond to logical values '011', '101', '001', '110', '010', '100', and '000', respectively.

Figure 2:
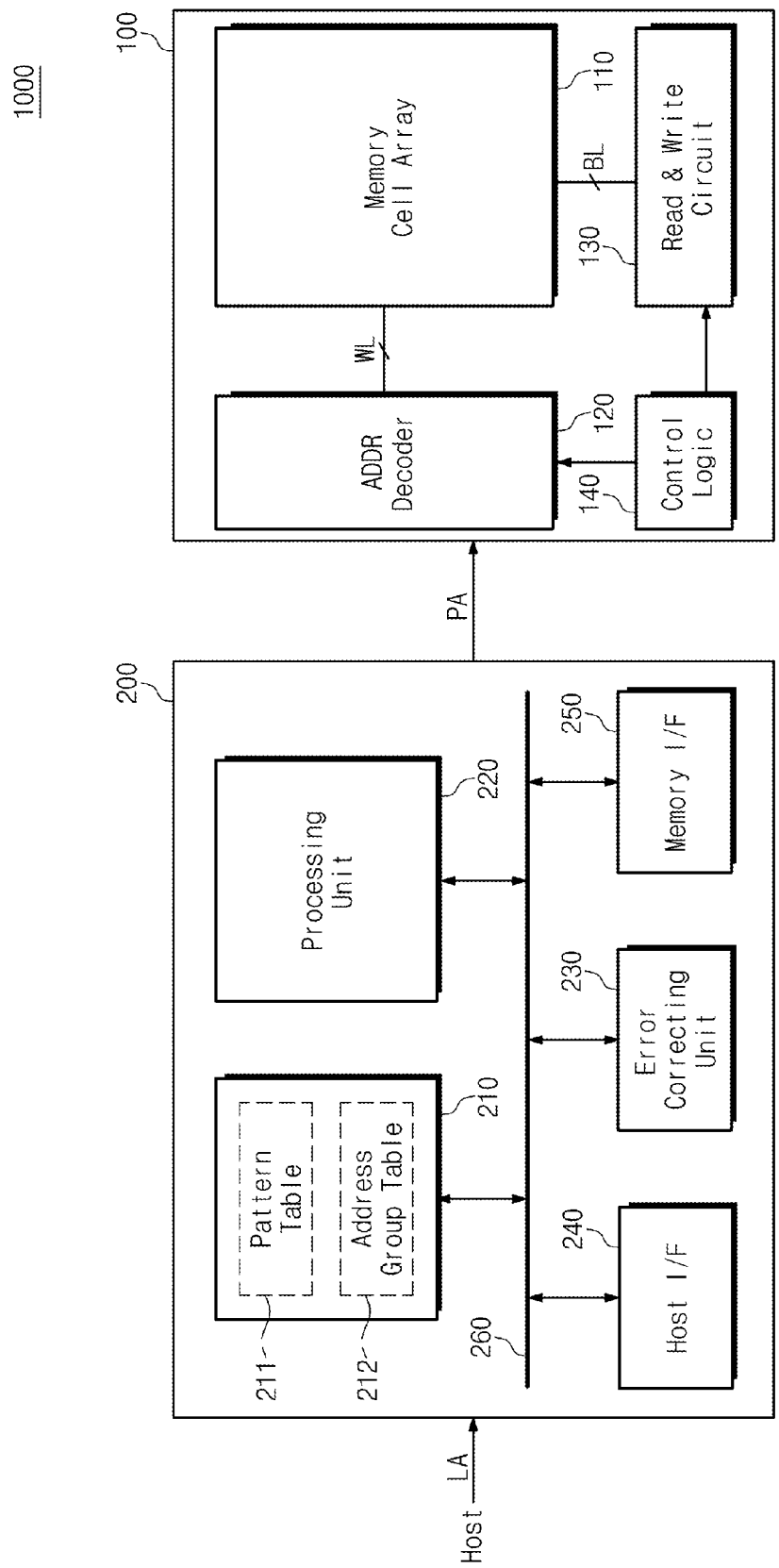
FIG. 2 is a block diagram illustrating a memory system according to an embodiment of the inventive concept.

FIG. 2 is a block diagram illustrating a memory system 1000 according to an embodiment of the inventive concept.

Referring to FIG. 2, memory system 1000 comprises a nonvolatile memory 100 and a memory controller 200.

Nonvolatile memory 100 stores data according to a physical address PA input from memory controller 200 in a program operation, and it outputs data according to a physical address PA input from memory controller 200 in a read operation. Nonvolatile memory 100 can comprise, for instance, at least one ROM, PROM, EPROM, EEPROM, flash memory, PRAM, MRAM, RRAM, and/or FRAM.

Memory controller 200 is connected between nonvolatile memory 100 and a host, and it provides an interface between these features. In addition, memory controller 200 is configured to control read, program, and erase operations of nonvolatile memory 100. In read and program operations, memory controller 200 translates a logical address LA from the host into physical address PA, and accesses nonvolatile memory 100 by providing the translated physical address PA to nonvolatile memory 100. Memory controller 200 typically comprises firmware designed to control nonvolatile memory 100.

Nonvolatile memory 100 comprises a memory cell array 110, an address decoder 120, a read/write circuit 130, and control logic 140.

Memory cell array 110 is coupled with address decoder 120 via word lines WL and with read/write circuit 130 via bit lines BL. Memory cell array 110 comprises a plurality of memory blocks. Each memory block comprises a plurality of physical pages, and each physical page comprises a plurality of memory cells sharing one word line. The memory cells in memory cell array 110 are arranged in rows and columns connected to corresponding to word lines WL and bit lines BL.

The memory cells of memory cell array 110 can store one or more bits using logic states such as those illustrated in FIG. 1. In general, as the number of bits stored in each memory cell increases, the storage capacity of memory cell array 110 tends to increase and the speed of program and read operations tends to decrease.

Memory cell array 110 can include memory cells that store different numbers of bits. For example, it can include some memory cells that store 1 bit, some memory cells that store 2 bits, and so on. Moreover, these memory cells can be divided into memory cell groups according to the number of bits that they store. For example, if memory cell array 110 has memory cells of different cell levels (e.g., Level1, Level2, etc.), the memory cells can be divided into different memory cell groups corresponding to these levels.

Each physical page of memory cell array 100 can comprise one or more logical pages. For example, a physical page of memory cells having the first cell level can form one logical page. A physical page of memory cells having the third cell level can form three logical pages, with least significant bits (LSBs) stored in a first logical page, central significant bits (CSBs) stored in a second logical page, and most significant bits (MSBs) stored in a third logical page. Read and program operations of nonvolatile memory 100 are typically performed in units of a logical page, and logical address LA typically corresponds to one logical page.

Address decoder 120 is connected with memory cell array 110 via word lines WL. Address decoder 120 operates under the control of control logic 140, and it receives a physical address PA from memory controller 200. Address decoder 120 selects one logical page using physical address PA. Address decoder 120 generates a selection signal using input physical address PA. Read/write circuit 130 selects bit lines BL according to the selection signal.

Read/write circuit 130 is coupled with memory cell array 110 via bit lines BL. Read/write circuit 130 is configured to exchange data with memory controller 200. Read/write circuit 130 operates under the control of control logic 140. Read/write circuit 130 selects bit lines BL using the selection signal.

Read/write circuit 130 receives data from memory controller 200 and programs the input data in memory cell array 110. Read/write circuit 130 also reads data from memory cell array 110 and outputs the read data to memory controller 200. Read/write circuit 130 can also read data from a first storage area of memory cell array 110 and write the read data in a second storage area to perform a copy-back operation.

Read/write circuit 130 typically comprises features such as a page buffer, a column selector circuit, or a data buffer. Alternatively, read/write circuit 130 can include features such as a sense amplifier, a write driver, a column selector circuit, and a data buffer.

Control logic 140 is coupled with address decoder 120 and read/write circuit 130, and it is configured to control operations of nonvolatile memory 100. For example, control logic 140 typically operates in response to a control signal input from memory controller 200, and it controls address decoder 120 and read/write circuit 130 such that data is stored in a logical page within a physical page PA.

Memory controller 200 comprises a buffer unit 210, a processing unit 220, an error correcting unit 230, a host interface 240, a memory interface 250, and a bus 260.

Buffer unit 210 is connected with bus 260, and it operates under the control of processing unit 220. Buffer unit 210 stores a pattern table 211 and an address group table 212.

Pattern table 211 stores weight values corresponding to logical addresses input from the host. In general, the weight values can be assigned to the logical addresses in groups of logical addresses referred to as "particles". In other words, a plurality of logical addresses can be identified collectively as a "particle", and a single weight value can be assigned to the particle such that each logical address within the particle is associated with that weight value.

In general, the weight value of a particle reflects the frequency with which the logical addresses of the particle are accessed. For example, each time one of the logical addresses associated with the particle is accessed, the weight value of the particle can be increased to reflect the access.

Pattern table 211 is generally updated whenever a logical address LA is received from the host. For example, pattern table 211 can be updated whenever a logical address LA is received for a program operation or a read operation. For convenience of explanation, it is assumed that logical address LA is an address input from a host in a program operation.

Address group table 212 is generated based on pattern table 211. Logical addresses are divided into a plurality of address groups according to weight values in pattern table 211. Address group table 212 stores information about an address group in which each particle is included. This information can also be used to determine an address group in which each logical address is included. A cell level of memory cells in an address group can be identified according to address group information.

Upon power-off of nonvolatile memory 100, pattern table 211 and address group table 212 are stored in a predetermined area of nonvolatile memory 100. Upon power-on of nonvolatile memory 100, processing unit 220 stores pattern table 211 and address group table 212 in buffer unit 210.

Buffer unit 210 typically comprises a RAM such as an SRAM or DRAM. Buffer unit 210 can be used as at least one of a working memory of processing unit 220 or a buffer memory between nonvolatile memory 100 and the host.

Processing unit 220 is connected with buffer unit 210, error correcting unit 230, host interface 240, and memory interface 250 via bus 260. Processing unit 220 controls overall operations of memory controller 200. For example, processing unit 220 controls merge and garbage collection operations of nonvolatile memory 110.

Processing unit 220 can also perform a flash translation layer (FTL) function. For example, processing unit 220 can translate logical address LA received from the host into a physical address PA. A mapping relationship between logical addresses and physical addresses is stored in buffer unit 210. That is, buffer unit 210 further stores a mapping table that includes the mapping relationship between logical addresses and physical addresses.

Processing unit 220 maps address groups with memory cell groups based on the FTL function. Under the FTL function, each address group corresponds to a memory cell group. If addresses input from the host are reconfigured, the memory cells of each memory cell group corresponding to each address group may be changed.

A cell level of each memory cell group corresponding to each address group is identified according to address group information stored in address group table 212. For example, processing unit 220 can determine an address of a physical page corresponding to logical address LA by performing the FLT function. Processing unit 220 determines an address group including logical address LA from address group table 212. Processing unit 220 determines the number of logical pages included in the determined physical page according to the judged address group. Processing unit 220 generates a physical address PA including not only a physical page but also information about a logical page included in the physical page.

Processing unit 220 updates pattern table 211 in response to logical address LA input from the host. For example, processing unit 220 can increase a weight value corresponding to a particle including logical address LA input in a program operation.

Processing unit 220 is configured to generate or update address group table 212 based on pattern table 211. It is assumed that logical addresses input from the host are divided into a plurality of particles, and weight values corresponding to the plurality of particles are stored in pattern table 211. In some embodiments, a larger weight value indicates that the corresponding particle encompasses logical addresses that are accessed more frequently, while a smaller weight value indicates that the corresponding particle encompasses logical addresses that are accessed less frequently.

Processing unit 220 divides particles into a plurality of address groups according to weight values of pattern table 211. Accordingly, the particles are divided according to how frequently they are accessed by the host. Processing unit 220 stores information about an address group including each particle in address group table 212.

Pattern table 211 is updated according to logical address LA input in a program operation. The weight value corresponding to logical address LA can be changed according to the logical address input at a program operation. Processing unit 220 reconfigures logical addresses according to weight values of pattern table 211. Processing unit 220 updates address group table 212 by changing information about an address group including each address.

Error correcting unit 230 detects and corrects erroneous bits of data read from nonvolatile memory 100 using an error correcting code (ECC), and the resulting error-corrected data is transferred to the host.

Host interface 240 implements a data exchange protocol between the host and memory controller 200. Host interface 240 transfers logical address LA input from the host into processing unit 220 via bus 260. Host interface 240 can communicate with an external device, such as the host, via at least one of various standardized protocols such as a universal serial bus (USB) protocol, a multimedia card (MMC) protocol, a peripheral component interconnect (PCI) protocol, a PCI-express (PCI-E) protocol, an advanced technology attachment (ATA) protocol, a serial-ATA (SATA) protocol, a parallel-ATA (PATA) protocol, a small computer small interface (SATA) protocol, an enhanced small disk interface (ESDI) protocol, or an integrated drive electronics (IDE) protocol.

Memory interface 250 provides an interface between nonvolatile memory 100 and memory controller 200. Memory interface 250 can comprise, for example, a NAND interface or a NOR interface.

Bus 260 provides at least one channel for connecting buffer unit 210, processing unit 220, error correcting unit 230, host interface 240, and memory interface 250.

Figure 3:
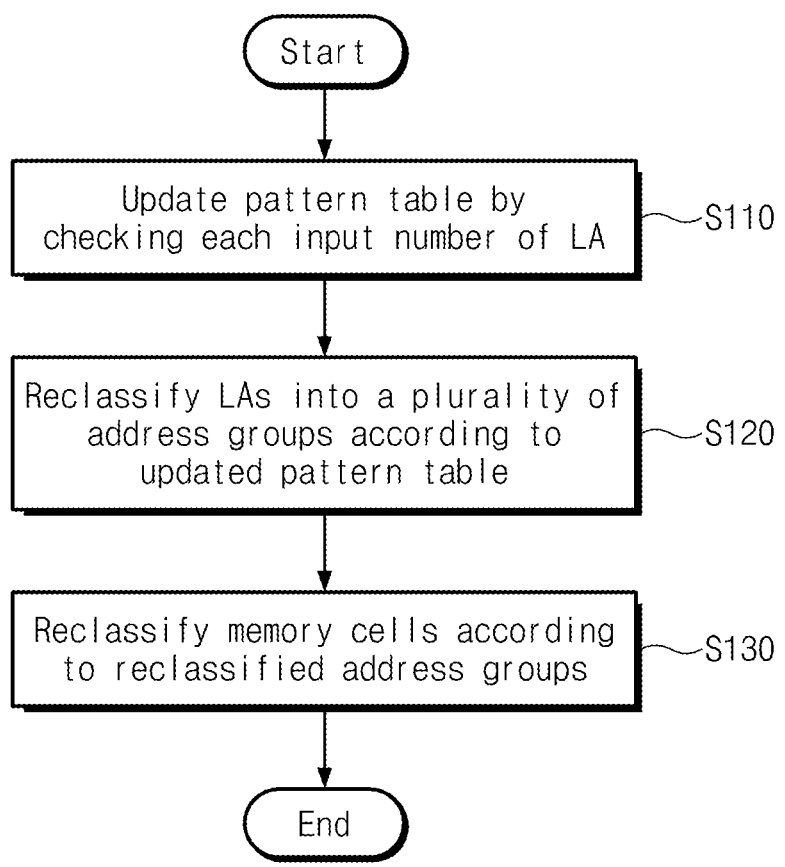
FIG. 3 is a flowchart illustrating a method of updating an address group table in the memory system of FIG. 2 according to an embodiment of the inventive concept.

FIG. 3 is a flowchart illustrating a method of updating an address group table in FIG. 2 according to an embodiment of the inventive concept.

Referring to FIGS. 2 and 3, in an operation S110, processing unit 220 updates pattern table 211 according to the number of times each logical address LA has been input to nonvolatile memory 100. This number is referred to as the input number of each logical address LA. Processing unit 220 divides logical addresses input from the host into a plurality of particles, and increases a weight value of a particle including logical address LA whenever the logical address is received from the host.

In an operation S120, processing unit 220 reconfigures addresses input from the host into a plurality of address groups based on the updated pattern table 211. For example, as the input number of a received logical address LA changes, it may be necessary to assign the received logical address LA to a different address group. Moreover, processing unit 220 may divide or reconfigure particles into different address groups according to weight values of pattern table 211.

In an operation S130, processing unit 220 reconfigures memory cells of nonvolatile memory 100 according to reconfigured logical address groups.

A logical address is mapped to a logical page. In other words, a logical address corresponds to a logical page. Where the number of logical addresses in each address group is changed, a capacity of a memory cell group corresponding to each address group is changed. For example, where a logical address of a first address group is included in a second address group, the number of memory cells of a memory cell group corresponding to the first address group decreases, and the number of memory cells of a memory cell group corresponding to the second address group increases. This means that the number of memory cells included in each memory cell group is varied when the number of logical addresses included in each address group is changed.

Figure 4:
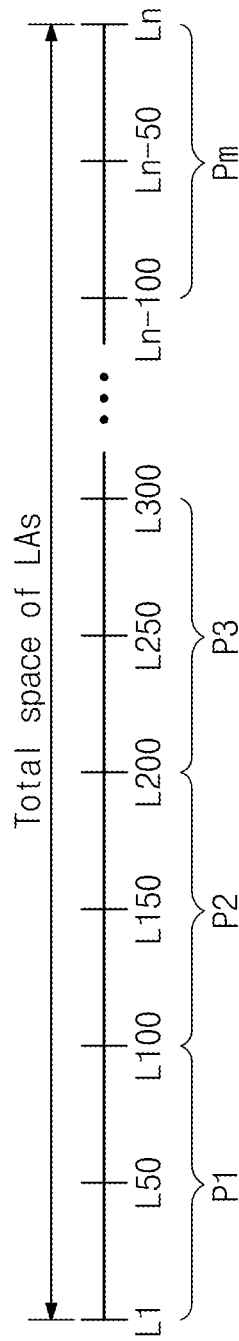
FIG. 4 is a diagram illustrating a space of logical addresses input to the memory system of FIG. 2 from a host.

FIG. 4 is a diagram illustrating a total space of logical addresses input from a host in FIG. 2.

Referring to FIGS. 2 and 4, memory controller 200 receives a first through n-th logical addresses L1 through Ln. The total space of logical addresses input from a host is formed of the first through n-th logical addresses L1 through Ln, which are grouped into a plurality of particles P1 through Pm.

FIG. 5 is a diagram illustrating an example of pattern table 211 of FIG. 2 according to an embodiment of the inventive concept. In the example of FIG. 5, pattern table 211 has weight values sorted in a descending order.

Referring to FIGS. 2 and 5, pattern table 211 stores weight values corresponding to a plurality of particles. Pattern table 211 is continually updated according to a method such as that illustrated in FIG. 3. Processing unit 220 increases a weight value corresponding to logical address LA whenever logical address LA is received from the host. For example, processing unit 220 can increase a weight value corresponding to logical address LA by 0.005 whenever logical address LA is received. A ratio of a sum of all weight values to a weight value can correspond to a ratio of a total access number of a host to an access number of a particle.

A plurality of particles may be divided into a plurality of address groups according to magnitudes of weight values. For example, a plurality of particles may be divided into a plurality of address groups according to predetermined critical values. Referring to FIG. 5, particles having weight values greater than or equal to 0.04 form a first address group AG1, particles having weight values greater than or equal to 0.03, but less than 0.04, form a second address group AG2, and particles having weight values greater than or equal to 0, but less than 0.03, form a third address group AG3.

A weight value corresponding to each logical address LA may be varied according to an input number of each logical address LA. If a weight value of logical address LA is varied, it may be assigned to a different address group.

In an example embodiment, a memory cell group corresponding to first address group AG1 requires a fast operating speed. Accordingly, first address group AG1 is formed of particles having large weight values. The memory cell group corresponding to first address group AG1 is controlled to have the first cell level. A memory cell group corresponding to second address group AG2 is controlled to have the second cell level. A memory cell group corresponding to third address group AG3 is controlled to have the third cell level.

FIG. 6 is a diagram illustrating an example of address group table 212, which is updated according to pattern table 211 of FIG. 5.

Referring to FIGS. 2, 5, and 6, address group table 212 stores address group information AGI corresponding to each particle. Processing unit 220 can determine an address group including logical address LA input from the host according to address group table 212. Accordingly, processor 220 can determine, for instance, the number of logical pages included in a physical page corresponding to input logical address LA based on address group information AGI.

Figure 7:
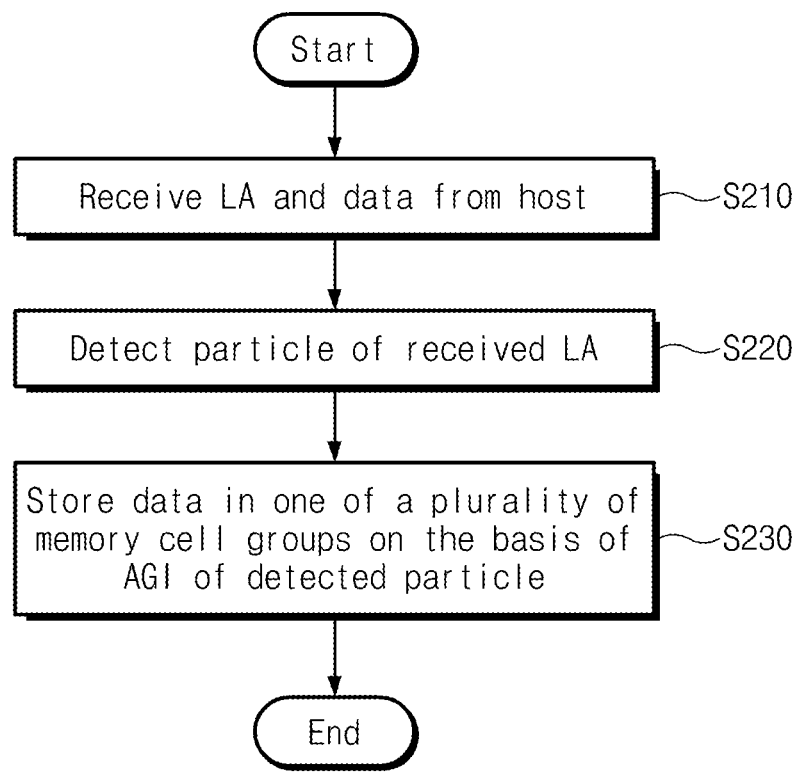
FIG. 7 is a flowchart illustrating a method of storing data input having a particular logical address according to the address group table of FIG. 6.

FIG. 7 is a flowchart illustrating a method of storing data input with a logical address according to address group table 212 of FIG. 6.

Referring to FIGS. 2 and 7, in an operation S220, logical address LA and program data are received from the host. Then, in an operation S220, processing unit 220 detects a particle including input logical address LA.

Thereafter, in an operation S230, program data is stored in one of a plurality of memory cell groups based on address group information AGI including the detected particle. In particular, processing unit 220 receives address group information AGI including the detected particle based on address group table 212. That is, processing unit 220 receives address group information AGI indicating the address group in which input logical address LA is included.

In this embodiment, processing unit 220 determines an address of a physical page corresponding to logical address LA by performing an FTL function. Processing unit 220 determines a cell level of a physical page in which the writing data is to be stored, according to address group information AGI. Processing unit 220 determines the number of logical pages included in the determined physical page. Processing unit 220 generates a physical address PA including address information including a physical page and a logical page included in the physical page. Information about a mapping relationship between logical addresses LA and physical addresses PA is stored in a buffer unit 210 in a mapping table format.

Figure 8:
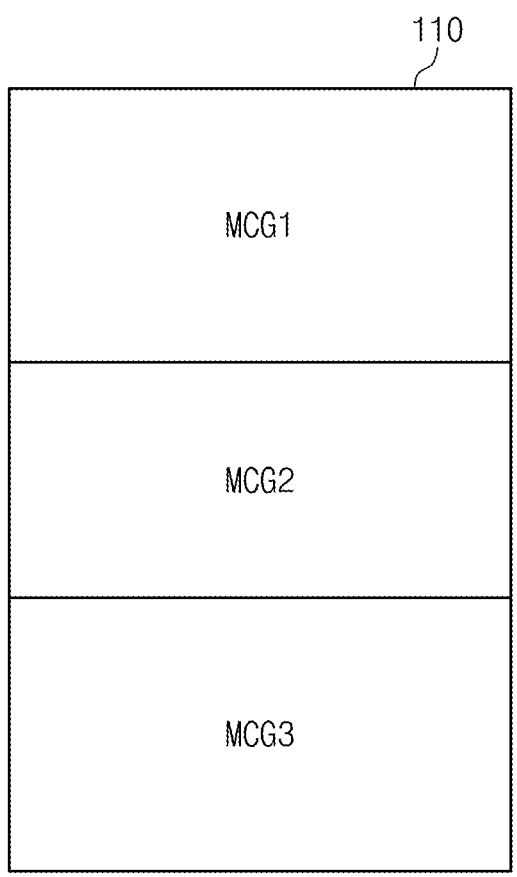
FIG. 8 is a diagram illustrating first through third memory cell groups each corresponding to first through third address groups illustrated in FIG. 5.

FIG. 8 is a diagram illustrating first through third memory cell groups each corresponding to first through third address groups in FIG. 5.

Referring to FIG. 8, a memory cell array 110 is divided into a plurality of memory cell groups MCG1 through MCG3. Memory cell array 110 is divided into a plurality of memory cell groups MCG1 through MCG3 conceptually, but not physically.

Memory controller 200 controls nonvolatile memory 100 such that first through third memory cell groups MCG1 through MCG3 have different cell levels form one another. For example, processing unit 220 can refer to address group table 212 to control nonvolatile memory 100 such that first through third memory cell groups MCG1 through MCG3 have different cell levels form one another.

It is assumed that memory cells in first memory cell group MCG1 have the first cell level. That is, memory cells in first memory cell group MCG1 are controlled to store 1-bit data. It is assumed that memory cells in second memory cell group MCG2 operate at the second cell level. That is, memory cells in second memory cell group MCG2 are controlled to store 2-bit data. It is assumed that memory cells in third memory cell group MCG3 operate at the third cell level. That is, memory cells in third memory cell group MCG3 are controlled to store 3-bit data.

As the input number of each logical address varies, memory cells of memory cell array 110 are reconfigured accordingly. Consequently, the number of memory cells included within each memory cell group may be varied.

Figure 9:
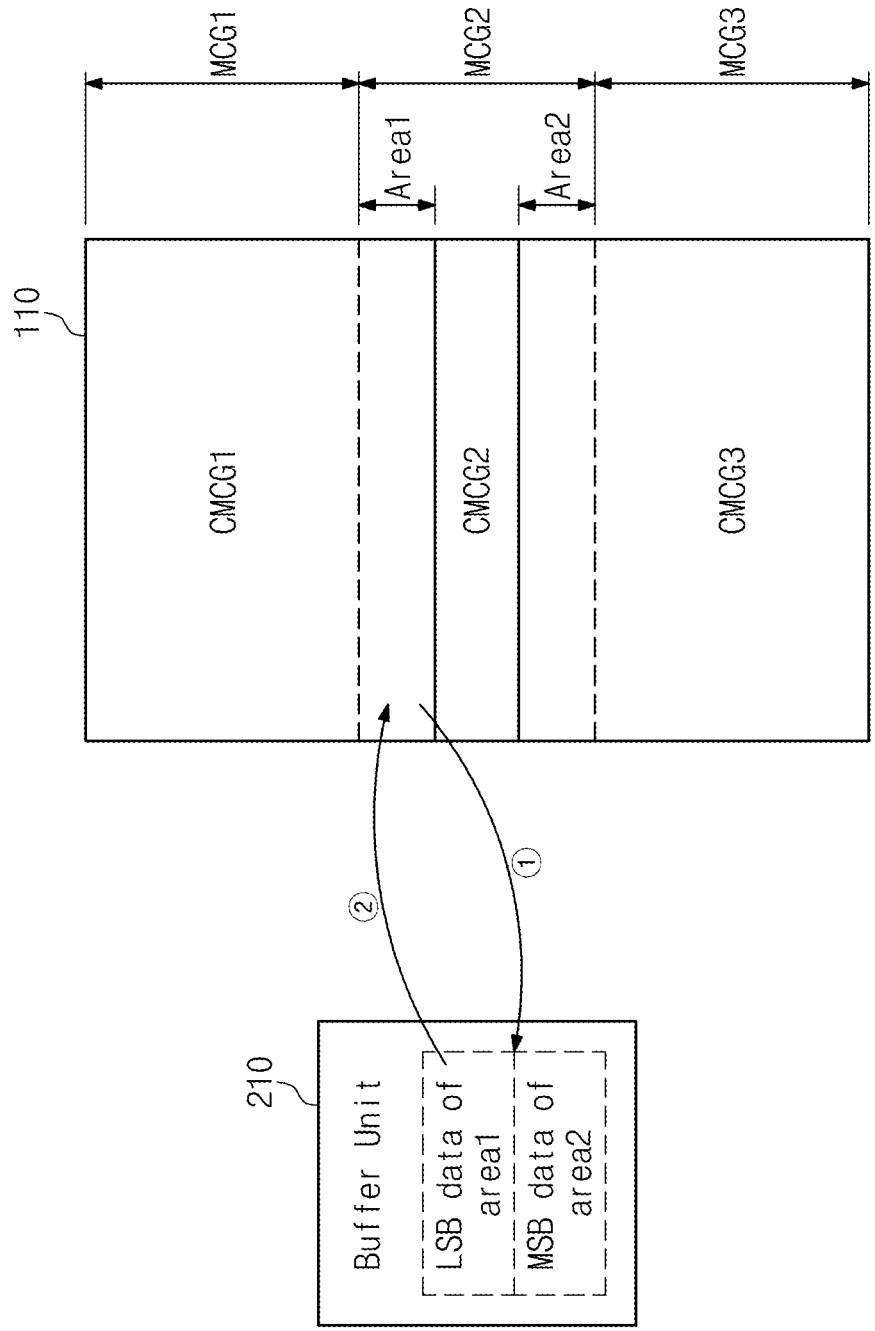
FIGS. 9 and 10 are diagrams illustrating a method of managing stored data when memory cells of a memory cell array in FIG. 8 are changed to different memory groups according to an embodiment of the inventive concept.
Figure 10:
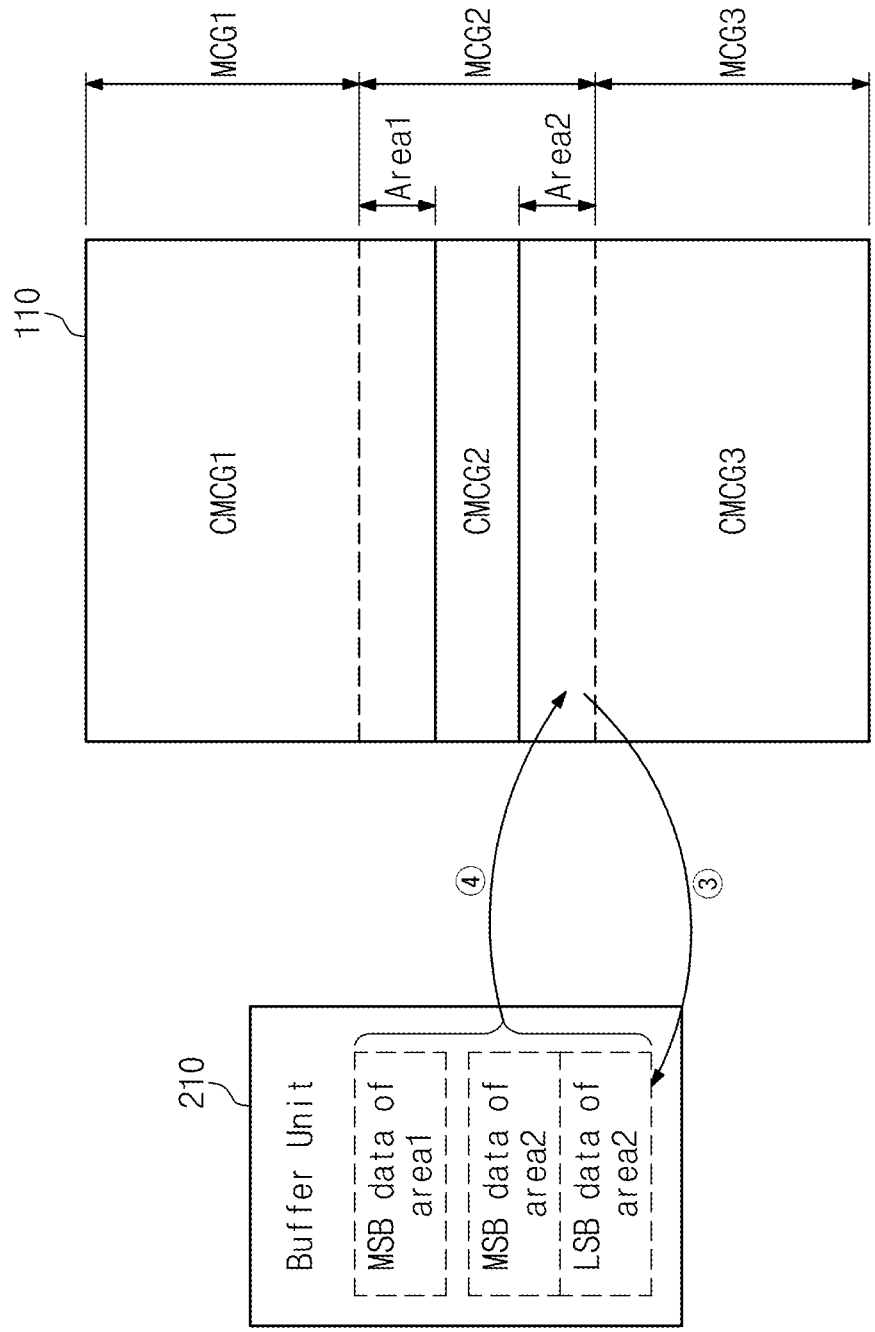

FIGS. 9 and 10 are diagrams illustrating a method of managing data stored in memory cells when memory cells of the memory cell array in FIG. 8 are reassigned to different memory groups. As memory cells are reconfigured, the number of memory cells included within each memory cell group may be varied. Capacities of first through third memory cell groups MCG1 through MCG3 are changed.

Referring to FIGS. 8 and 9, a memory cell group including a first area Area1 is changed from second memory cell group MCG2 into a first changed memory cell group CMCG1. The cell level of first area Area1 is changed from the second cell level to the first cell level according to the above-described assumptions. A memory cell group including a second area Area2 is changed from second memory cell group MCG2 into a third changed memory cell group CMCG3. The cell level of second area Area2 is changed from the second cell level to the third cell level according to the above-described assumptions.

Before the cell level of first area Area1 is changed, LSB and MSB data stored in first area Area1 are stored in a buffer unit 210 (①). A cell level of first area Area1 is changed from the second cell level to the first cell level. A capacity of first area Area1 is reduced by half. Afterwards, a part of data stored in buffer unit 210 is stored in first area Area1. For instance, FIG. 9 illustrates an example where LSB data read from first area Area1 is stored in first area Area1 (②).

Referring to FIG. 10, before the cell level of second area Area2 is changed, LSB and MSB data stored in second area Area2 are stored in buffer unit 210 (③). A cell level of second area Area2 is changed from the second cell level to the third cell level. The capacity of second area Area2 increases one and a half times. Afterwards, MSB data read from first area Area1 and LSB and MSB data read from second area Area2, which are stored in buffer unit 210, are stored in second area Area2 (④).

In the examples of FIGS. 9 and 10, stored data remains in first and second areas Area1 and Area2. This data retention can be achieved, for instance, by performing merge and garbage collection operations on nonvolatile memory 100.

Figure 11:
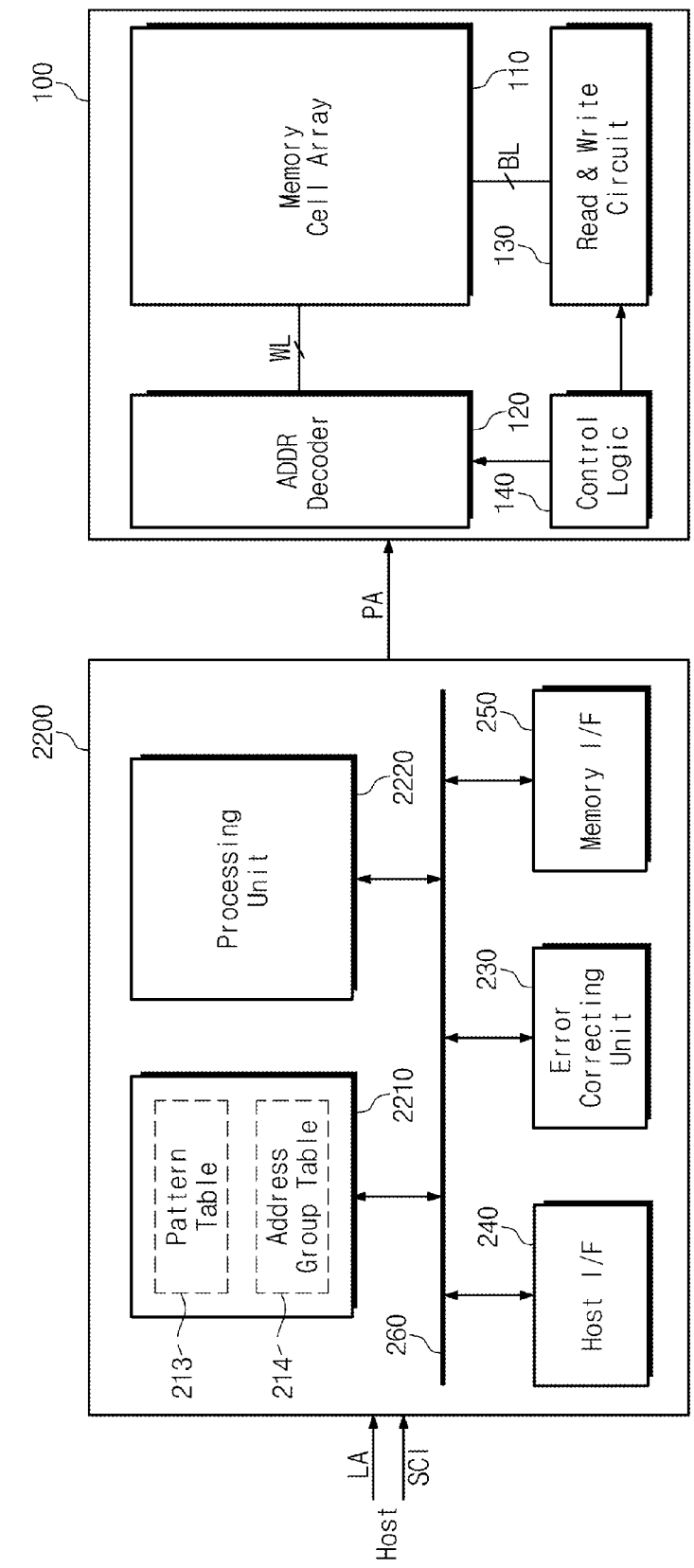
FIG. 11 is a block diagram illustrating a memory system according to an embodiment of the inventive concept.

FIG. 11 is a block diagram illustrating a memory system 2000 according to an embodiment of the inventive concept.

Referring to FIG. 11, memory system 2000 comprises nonvolatile memory 100 and a memory controller 2200.

Nonvolatile memory 100 is described above in relation to FIG. 2. Memory controller 2200 comprises a buffer unit 2210, a processing unit 2220, error correcting unit 230, host interface 240, memory interface 250, and bus 260. Elements 230, 240, 250, and 260 of FIG. 11 are substantially the same as those illustrated in FIG. 2.

Memory controller 2200 receives storage capacity information SCI from a host. Storage capacity information SCI is information for determining a storage capacity of nonvolatile memory 100. It is assumed that nonvolatile memory 100 has a maximum storage capacity of 150 GB, and that nonvolatile memory 100 comprises 50 G memory cells each capable of storing up to three bits of data. Storage capacity information SCI for setting up nonvolatile memory 100 to storage capacity of 150 GB is received from the host. Initially, all memory cells of nonvolatile memory 100 are controlled to have the third cell level.

Storage capacity information SCI can be set up by a user. For example, the user may select the storage capacity of nonvolatile memory 100 via a user interface.

Memory cells of nonvolatile memory 100 may have one of a plurality of cell levels, respectively. Below, it is assumed that a cell level of each memory cell of nonvolatile memory 100 has one of the first through third cell levels. That is, nonvolatile memory 100 may include memory cells having the first cell level, memory cells having the second cell level, and memory cells having the third cell level. However, the inventive concept is not limited thereto.

Below, the respective proportions or ratios of memory cells having the first cell level, the second cell level, and the third cell level can be encapsulated by a corresponding combination of ratios R1, R2, and R3. For a memory system having three cell levels, the corresponding ratios add up to one as illustrated by the following equation (1).

$$R1+R2+R3=1 \quad (1)$$

In equation (1), R1 represents a proportion, or ratio, of memory cells with the first cell level, R2 represents a proportion of memory cells having the second cell level, and R3 represents a proportion of memory cells having the third cell level.

The storage capacity of nonvolatile memory 100 is determined according to storage capacity information SCI input from the host. Storage capacity SC of nonvolatile memory 100 is expressed by the following equation (2).

$$SC=(1 \times MC \times R1)+(2 \times MC \times R2)+(3 \times MC \times R3) \quad (2)$$

In equation (2), SC represents the storage capacity of nonvolatile memory device 100 according to storage capacity information SCI. MC represents a storage capacity of nonvolatile memory 100 when cell levels of all memory cells of nonvolatile memory 100 are the first cell level, respectively. For example, if nonvolatile memory 100 comprises 50 G memory cells, the MC may be 50 GB. Herein, the MC may correspond to the number of memory cells of nonvolatile memory 100.

A plurality of different ratio combinations satisfying equations (1) and (2) may exist (refer to FIG. 14). Any one of the ratio combinations satisfying equations (1) and (2) may be selected according to weight values of a pattern table 213. Particles of pattern table 213 may be classified into a plurality of address groups according to the selected ratio combination.

Buffer unit 2210 stores pattern table 213 and address group table 214. Pattern table 213 stores weight values corresponding to a plurality of particles, respectively. In some embodiments, pattern table 213 stores respective weight values corresponding to addresses input from a host.

Pattern table 213 further stores accumulated weight values and accumulated storage capacity information. This will be more fully described with reference to FIG. 13.

Address group table 214 stores address group information AGI (refer to FIG. 6) indicating an address group in which each particle is included. Processing unit 2220 classifies particles into the address groups based upon pattern table 213 and generates or updates address group table 214 according to the classified result.

Figure 12:
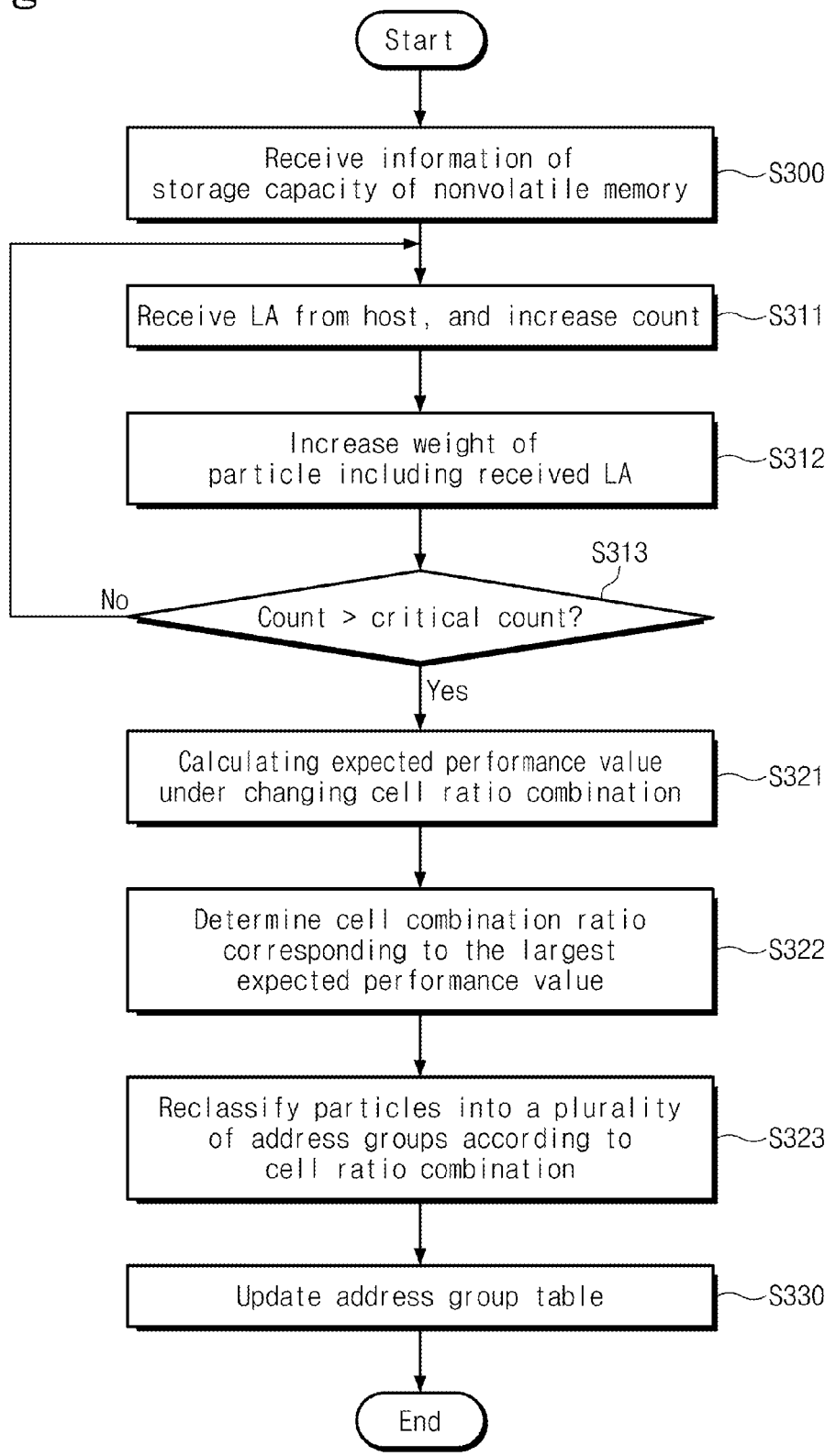
FIG. 12 is a flowchart illustrating a method of updating an address group table in FIG. 11 according to an embodiment of the inventive concept.

FIG. 12 is a flowchart illustrating a method of updating address group table 214 of FIG. 11 according to an embodiment of the inventive concept.

Referring to FIGS. 11 and 12, in an operation S300, a memory controller 2200 receives storage capacity information SCI of a nonvolatile memory 100 from a host.

Similar to operation S110 of FIG. 3, operations S311 to S313 are executed to update pattern table 213 according to an input number of each logical address.

In an operation S311, memory controller 2200 receives logical address LA from the host, and a count value is increased. The count value is typically stored in a processing unit 2220. Alternatively, the count value can be stored in a buffer unit 2210. The count value increases whenever a logical address is received.

In an operation S312, processing unit 2220 searches for a particle including input logical address LA and increases a weight corresponding to the particle.

In an operation S313, processing unit 2220 determines whether the count value is greater than a critical count value. Where the count value is greater than the critical count value (S313=Yes), the method proceeds to operation S321. Otherwise, where the count value is less than the critical count value (S313=No), the method proceeds to operation S311. That is, processing unit 2220 increases a weight of a particle including logical address LA input from a host until the count value reaches the critical count value.

Operations S321 to S323 are executed to classify addresses input from the host into a plurality of address groups according to an updated pattern table.

In an operation S321, processing unit 2220 calculates an expected performance value referring to pattern table 213, with a combination of ratios being changed. The expected performance value is a value corresponding to an operating performance of a memory system 2000. For example, the expected performance value is a value indicating an operating speed (e.g., read and write speeds) of memory system 2000. A method of calculating the expected performance value will be more fully described with reference to FIGS. 12 and 13.

In an operation S322, processing unit 2220 determines a combination of ratios corresponding to the maximum expected performance value of memory system 2000. In an operation S323, processing unit 2220 reclassifies particles into a plurality of address groups according to the determined combination of ratios.

In an operation S330, processing unit 2220 updates address group table 214. Processing unit 2220 changes information about particles included each address groups within address group table 214.

FIG. 13 is a diagram illustrating an example of pattern table 213 of FIG. 11. Referring to FIGS. 11 and 13, pattern table 213 stores weight values corresponding to a plurality of particles, respectively. As described with reference to FIG. 12, processing unit 2220 increases a count value whenever logical address LA is received, and increases a weight value corresponding to logical address LA. Where the count value reaches a critical count value, an address table 214 is generated or updated according to pattern table 213.

Pattern table 213 further stores accumulated weight values. Processing unit 2220 calculates accumulated weight values according to weight values arranged in a descending order. An accumulated weight value of each particle is obtained by adding a weight value of each particle and all weight values more than the weight value. FIG. 13 shows an example of pattern table 213 in which weight values are arranged in a descending order. In this case, an accumulated weight value of each particle is calculated by adding a weight value of each particle and weight values of particles arranged above each particle.

Each logical address may correspond to a logical page. In FIG. 13, the number of particles is 200. Accordingly, a storage capacity of logical pages corresponding to each particle is 1/200. A ratio of a storage capacity of a nonvolatile memory 100 according to storage capacity information SCI and a storage capacity of logical pages corresponding to each particle may be determined according to the number of whole particles.

Pattern table 213 further stores accumulated storage capacity information. The accumulated storage capacity information is calculated by adding a storage capacity of logical pages corresponding to each particle and weight values of logical pages arranged above each particle.

FIG. 14 is a diagram illustrating combination of ratios according to an embodiment of the inventive concept. In FIG. 14, combination of ratios may satisfy the above-described equations (1) and (2). A processing unit 2220 calculates an expected performance value with a combination of ratios being changed. In this case, the ratio combination may be changed according to storage capacity information SCI such that a sum of a storage capacity of memory cells of a first cell level, a storage capacity of memory cells of a second cell level, and a storage capacity of memory cells of a third cell level is maintained constantly.

Referring to FIG. 14, in each case, a sum of R1, R2, and R3 may become 1. When MC in equation 2 is 50, a storage capacity of memory cells of the first cell level, a storage capacity of memory cells of the second cell level, and a storage capacity of memory cells of the third cell level are illustrated in FIG. 14, respectively.

Where MC in equation (2) is 50, a sum of the storage capacity of memory cells of the first cell level, the second cell level, and the third cell level is 100. As indicated in FIG. 14, the combination of ratios is determined such that the sum of the storage capacity of memory cells of the first cell level, the second cell level, and the third cell level is maintained constant.

FIG. 14 illustrates a proportion of a storage capacity provided by memory cells of the first cell level (hereinafter, referred to as a first ratio), a proportion of the storage capacity provided by memory cells of the second cell level (hereinafter, referred to as a second ratio), and a proportion of the storage capacity provided by memory cells of the third cell level (hereinafter, referred to as a third ratio).

An expected performance value of nonvolatile memory 100 can be calculated from values in FIG. 14 according to the following equation (3).

$$F=(F1\times T1)+(F2\times T2)+(F3\times T3) \quad (3)$$

In equation (3), F represents the expected performance value of nonvolatile memory 100. T1 represents an access ratio of memory cells having the first cell level. T2 represents an access ratio of memory cells having the second cell level. T3 represents an access ratio of memory cells having the third cell level. A sum of T1, T2, and T3 may be 1. T1, T2, and T3 can be determined according to weight values of pattern table 213.

F1 represents an operating performance of memory cells having the first cell level. F2 represents an operating performance of memory cells having the second cell level. F3 represents an operating performance of memory cells having the third cell level. F1, F2, and F3 are typically constant values.

Processing unit 2220 calculates the expected performance value of each case shown in FIG. 14 by applying a combination of ratios of each case to pattern table 213. Processing unit 2220 determines T1, T2, and T3 by comparing the first through third ratios for each case with accumulated storage capacity information within pattern table 213.

For example, in the second case Case2, the first, second, and third ratios correspond to storage capacities of 1, 96, and 3, respectively. Referring to accumulated storage capacity information of pattern table 213 in FIG. 13, a storage capacity of logical pages corresponding to particles from a first row to a second row among a storage capacity of nonvolatile memory 100 according to storage capacity information SCI is 1%. A sum of weight values corresponding to particles from a first row to a second row is 0.2. That is, where memory cells including logical pages corresponding to particles from a first row to a second row operate at a first cell level, 20% of a whole access concentrates on memory cells having the first cell level. At this time, T1 in equation 3 is 0.2.

A storage capacity of logical pages corresponding to particles from a $3^{rd}$ row to a 194-th row among a storage capacity of nonvolatile memory 100 according to storage capacity information SCI is 96%. A sum of weight values corresponding to particles from the $3^{rd}$ row to a $194^{th}$ row is 0.8. That is, when memory cells including logical pages corresponding to particles from the $3^{rd}$ row to the $194^{th}$ row operates at a second cell level, 80% of a whole access concentrates on memory cells having the second cell level. At this time, T2 in equation 3 is 0.8.

A storage capacity of logical pages corresponding to particles from a $195^{th}$ row to a $200^{th}$ row among a storage capacity of nonvolatile memory 100 according to storage capacity information SCI is 3%. A sum of weight values corresponding to particles from a $195^{th}$ row to a $200^{th}$ row is 0. That is, when memory cells including logical pages corresponding to particles from a $195^{th}$ row to a $200^{th}$ row operates at a third cell level, 0% of a whole access concentrates on memory cells having the third cell level. At this time, T3 in equation 3 is 0.

Because F1, F2, and F3 are constant values and T1, T2, and T3 are determined, the expected performance value may be calculated. Assuming that F1, F2, and F3 are 6, 3, and 1, the expected performance value is 3.6.

Processing unit 2220 may calculate the expected performance values of remaining cases similar to the second case. Processing unit 2220 detects the largest expected performance value among the calculated expected performance values. Processing unit 2220 may classify particles arranged within pattern table 213 into the first through third address groups AG1 to AG3 according to a combination of ratios corresponding to the largest expected performance value. Processing unit 2220 stores information about an address group including each particle in an address group table 214, every particle. Memory cells of nonvolatile memory 100 divided into a plurality of memory cell groups may be reclassified into changed memory cell groups. Although a combination of ratios is changed, a storage capacity of a plurality of memory cell groups is identical to a storage capacity of changed memory cell groups.

Figure 15:
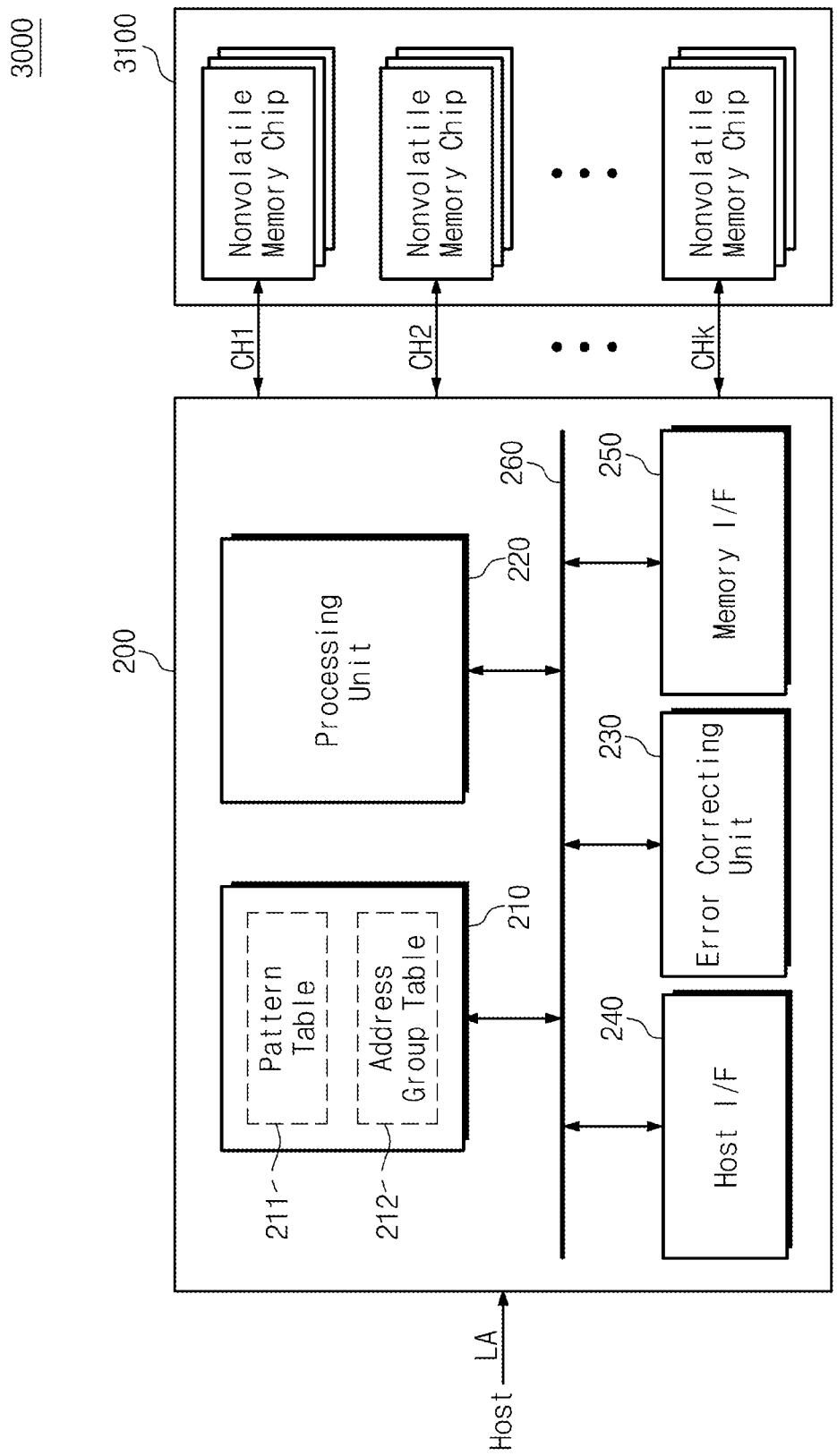
FIG. 15 is a block diagram illustrating a memory system according to an embodiment of the inventive concept.

FIG. 15 is a block diagram illustrating a memory system 3000 according to an embodiment of the inventive concept. Memory system 3000 is a variation of memory system 100 of FIG. 2.

Referring to FIG. 15, memory system 3000 comprises a nonvolatile memory 3100 and a memory controller 200. Nonvolatile memory 3100 comprises a plurality of nonvolatile memory chips divided into a plurality of groups. Nonvolatile memory chips in each group communicate with memory controller 200 via a common channel. For example, a plurality of nonvolatile memory chips may communicate with memory controller 200 via k channels CH1 through CHk.

Each of nonvolatile memory chips is identical to a nonvolatile memory 100 in FIG. 2, and memory controller 200 is substantially identical to that in FIG. 2. That is, memory controller 200 updates pattern table 211 according to logical address LA. Memory controller 200 stores address group information including each particle in an address group table 212 according to pattern table 211. Memory controller 200 assigns memory cell groups of nonvolatile memory 3100 to a plurality of address groups, respectively. Memory cell groups of nonvolatile memory 3100 are controlled to have different cell levels.

FIG. 15 illustrates a plurality of nonvolatile memory chips connected with a single channel. However, memory system 3000 can be modified such that different nonvolatile memory chips are coupled with different channels.

Memory controller 200 and nonvolatile memory 3100 can be integrated in a single semiconductor device to form a memory card. For example, memory controller 200 and nonvolatile memory 3100 can be integrated in a memory card such as a PC (PCMCIA) card, a CF card, an SM (or, SMC) card, a memory stick, a multimedia card (MMC, RS-MMC, MMCmicro), a security card (SD, miniSD, microSD, SDHC), or a universal flash storage (UFS) device. Memory controller 200 and nonvolatile memory 3100 can also be integrated in a single semiconductor device to form other types of devices, such as a solid state drive (SSD).

Memory system 3000 can also be incorporated in various electronic devices, such as a computer, portable computer, Ultra Mobile PC (UMPC), workstation, net-book, PDA, web tablet, wireless phone, mobile phone, smart phone, e-book, portable media player (PMP), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, or radio frequency identifier (RFID), for example.

Memory system 3000 can be packaged using various alternative package types or configurations, such as package on package (PoP), ball grid array (BGA), chip scale package (CSP), plastic leaded chip carrier (PLCC), plastic dual in-line package (PDI2P), die in waffle pack, die in wafer form, chip on board (COB), ceramic dual in-line package (CERDIP), plastic metric quad flat pack (MQFP), thin quad flatpack (TQFP), small outline integrated circuit (SOIC), shrink small outline package (SSOP), thin small outline package (TSOP), system in package (SIP), multi chip package (MCP), wafer-level fabricated package (WFP), or wafer-level processed stack package (WSP).

Figure 16:
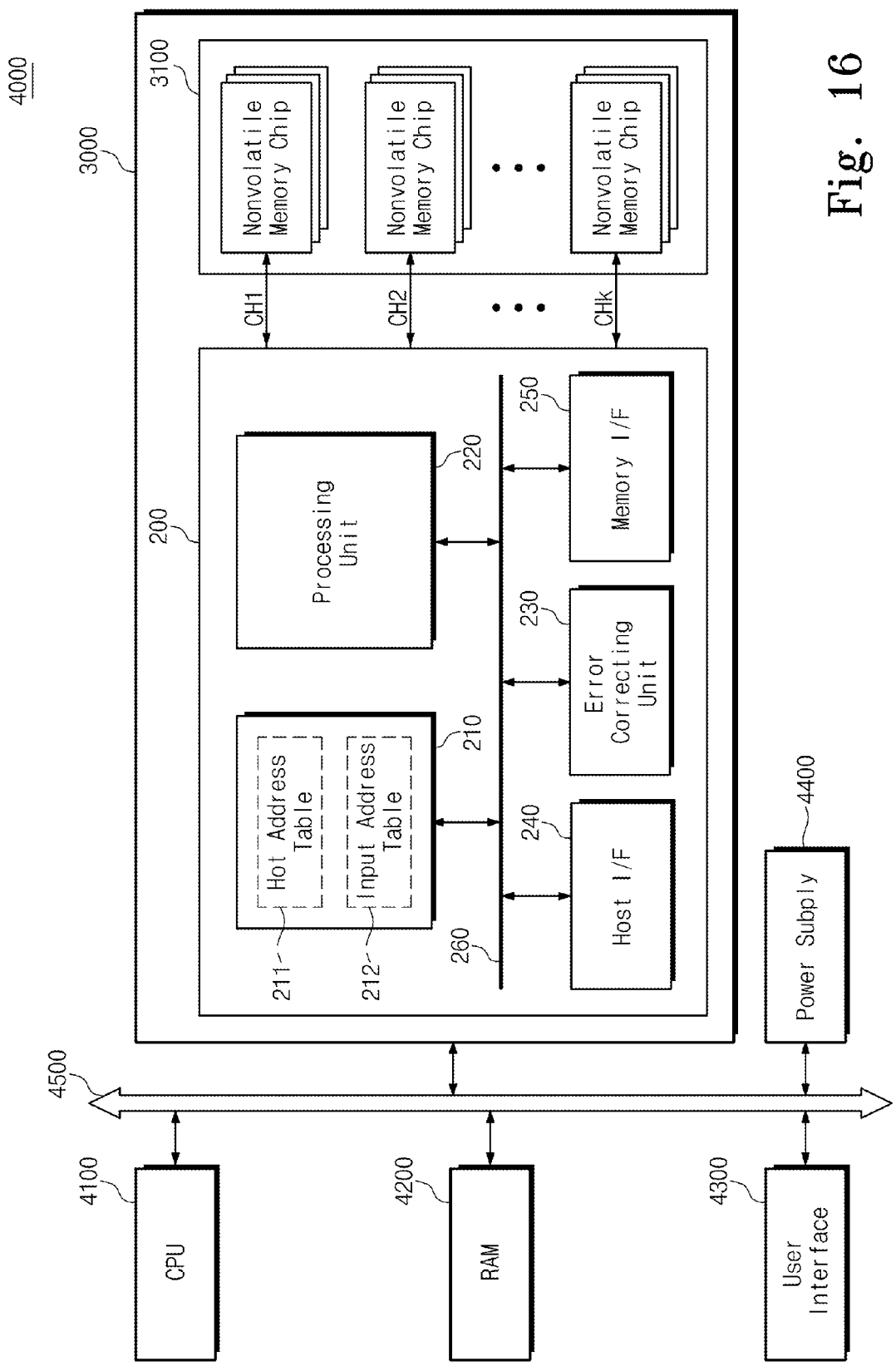
FIG. 16 is a block diagram illustrating a computing system including the memory system in FIG. 15 according to an embodiment of the inventive concept.

FIG. 16 is a block diagram of a computing system 4000 comprising memory system 3000 of FIG. 15.

Referring to FIG. 16, computing system 4000 comprises a CPU 4100, a RAM 4200, a user interface 4300, a power supply 4400, a system bus 4500, and memory system 3000.

Memory system 3000 is electrically connected with CPU 4100, RAM 4200, user interface 4300, and power supply 4400 via system bus 4500. Data provided via user interface 4300 or processed by CPU 4100 is stored in memory system 3000.

In the example of FIG. 16, nonvolatile memory 3100 is connected with system bus 4500 via memory controller 200. However, nonvolatile memory 3100 can alternatively be connected directly to system bus 4500, with various functions of processing unit 220 being performed by CPU 4100. In addition, functions of buffer unit 210 can alternatively be executed by RAM 4200. In yet another alternative, memory system 3000 can be replaced with memory system 1000 of FIG. 2.

As indicated by the foregoing, a memory system can control a nonvolatile memory to change the number of memory cells having each of various cell levels according to an input pattern of addresses from a host. This can improve the operating speed of the memory system.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory system, comprising:
    a nonvolatile memory comprising multiple memory cells; and
    a memory controller configured to control respective cell levels of the memory cells by assigning a logical address of each memory cell to one of multiple address groups according to a frequency with which the logical address has been accessed, determining a cell level for each address group, and controlling each memory cell to have the cell level of the address group to which its logical address is assigned,
    wherein the memory controller changes a number of memory cells operating at each cell level such that a storage capacity of the nonvolatile memory is maintained substantially constant.

2. The memory system of claim 1, wherein the memory controller changes the assignment of a logical address from one address group to another address group in response to a change in a number of times that the logical address has been accessed.

3. The memory system of claim 1, wherein the plurality of cell levels comprises a first cell level, a second cell level, and a third cell level, wherein a memory cell of the first cell level stores 1-bit data, a memory cell of the second cell level stores 2-bit data, and a memory cell of the third cell level stores 3-bit data, and
    wherein a storage capacity of the nonvolatile memory is maintained substantially constant by increasing a number of memory cells having the third cell level where a number of memory cells having the first cell level increases, and decreasing the number of memory cells having the third cell level where the number of memory cells having the first cell level decreases.

4. The memory system of claim 1, wherein each address group corresponds to a memory cell group comprising a plurality of memory cells of the same cell level.

5. The memory system of claim 4, wherein the number of memory cells in each memory cell group changes according to a number of logical addresses included in the corresponding address group.

6. The memory system of claim 4, wherein a storage capacity of a memory cell group corresponding to each address group is changed when the number of logical addresses in each address group is changed.

7. The memory system of claim 1, wherein the memory controller comprises:
    a buffer unit configured to store weight values corresponding to the respective logical addresses; and
    a processing unit configured to increase a weight value corresponding to a logical address received from the host.

8. The memory system of claim 1, wherein the logical addresses are grouped into a plurality of particles, and the memory controller comprises:
    a buffer unit configured to store weight values corresponding to the respective particles; and
    a processing unit configured to increase a weight value corresponding to a particle including a logical address upon receiving the logical address from the host.

9. The memory system of claim 8, wherein the processing unit causes multiple particles be included in one of the address groups according to respective weight values of the particles.

10. A method of controlling a nonvolatile memory comprising a plurality of memory cells, the method comprising:
    controlling the respective memory cells to operate at multiple different cell levels;
    assigning an address input from a host to one of multiple address groups each corresponding to a memory cell group comprising memory cell of the same cell level; and
    reassigning the address to a different address group according to a number of times that the address has been accessed,
    wherein reassigning the address to the different address group comprises changing a number of memory cells having the different cell levels such that a storage capacity of the nonvolatile memory remains substantially constant.

11. The method of claim 10, wherein the memory cells are classified into multiple memory cell groups each corresponding to one of the address groups, and when an address is received by the nonvolatile memory, memory cells of a memory cell group corresponding to an address group including the received address are accessed.

12. The method of claim 11, wherein the memory cells in the respective memory cell groups are controlled to operate at different cell levels.

13. The method of claim 11, wherein the number of memory cells in a memory cell group corresponding to an address group is changed when the number of addresses in the address group changes.

14. A method of operating a memory system comprising a host and a nonvolatile memory device, the method comprising:
    transmitting a logical address from the host to the nonvolatile memory device;

assigning the logical address to an address group according to a number of times the logical address has been accessed;

operating memory cells associated with the logical address at one of first through n-the cell levels according to a memory cell group associated with the address group; and changing a number of memory cells operating at each cell level such that a storage capacity of the nonvolatile memory is maintained substantially constant.

15. The method of claim 14, further comprising assigning the logical address to a particle, and assigning the particle to the address group according to a cumulative number of times that logical addresses of the address group have been accessed.

16. The method of claim 15, further comprising assigning a weight to the particle, and assigning particles of similar weight to the address group.

17. The method of claim 14, wherein the nonvolatile memory device is a flash memory device.

18. The method of claim 14, further comprising:

reassigning the logical address to a different address group according to a changed number of times the logical address has been accessed.

* * * * *